(12) United States Patent
Tseng

(10) Patent No.: US 9,298,091 B2
(45) Date of Patent: Mar. 29, 2016

(54) PHOTOSENSITIVE RESIN COMPOSITION AND USES THEREOF

(71) Applicant: CHI MEI CORPORATION, Tainan (TW)

(72) Inventor: Ching-Yuan Tseng, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 130 days.

(21) Appl. No.: 14/216,229

(22) Filed: Mar. 17, 2014

(65) Prior Publication Data

US 2014/0293400 A1 Oct. 2, 2014

(30) Foreign Application Priority Data

Mar. 29, 2013 (TW) .............................. 102111325 A

(51) Int. Cl.

| | | |
|---|---|---|
| *G02B 26/00* | (2006.01) | |
| *G02B 5/23* | (2006.01) | |
| *G03F 7/075* | (2006.01) | |
| *G02F 1/167* | (2006.01) | |
| *C09B 23/01* | (2006.01) | |
| *G02F 1/1335* | (2006.01) | |
| *C09B 67/22* | (2006.01) | |

(52) U.S. Cl.
CPC .............. *G03F 7/0757* (2013.01); *G02F 1/167* (2013.01); *C09B 23/0075* (2013.01); *C09B 67/0033* (2013.01); *G02F 1/1335* (2013.01); *G02F 1/133514* (2013.01); *G02F 2001/1678* (2013.01)

(58) Field of Classification Search
CPC ............ G02F 1/167; G02F 2001/1678; G02F 1/133514; G02F 1/1335; C09B 67/0033; C09B 23/0075; G03F 7/0757

USPC ................ 359/296; 252/586, 301.21, 301.34, 252/301.35; 430/280.1, 281.1, 286.1
See application file for complete search history.

(56) References Cited

U.S. PATENT DOCUMENTS

| | | | | |
|---|---|---|---|---|
| 7,556,843 | B2 * | 7/2009 | Kura .................. | C07D 295/112 427/500 |
| 2013/0244177 | A1 * | 9/2013 | Tseng ..................... | G03F 7/031 430/280.1 |

FOREIGN PATENT DOCUMENTS

| | | |
|---|---|---|
| JP | 2008-129599 | 6/2008 |
| JP | 2009-531727 | 9/2009 |
| TW | 201137519 A1 | 11/2011 |
| TW | 201310170 A1 | 3/2013 |

OTHER PUBLICATIONS

Office action and Search report issued on Sep. 2 for the corresponding Taiwan Patent Application No. 102111325.
Translation of the Search report issued on Sep. 2 for the corresponding Taiwan Patent Application No. 102111325.
Translation of TW 201137519 A1.
Translation of TW 201310170 A1.

* cited by examiner

*Primary Examiner* — Evelyn A Lester
(74) *Attorney, Agent, or Firm* — WPAT, P.C.; Anthony King

(57) ABSTRACT

The invention relates to a photosensitive resin composition; especially relates to a photosensitive resin composition that has good heat-yellowing resistance, surface roughness resistance, developability and brightness. The invention also provides a white matrix, a color filter and a reflective display element.

16 Claims, 4 Drawing Sheets

PHOTOSENSITIVE RESIN COMPOSITION AND USES THEREOF

BACKGROUND OF THE INVENTION

1. Field of the Invention

The invention relates to a photosensitive resin composition; particularly, to a white photosensitive resin composition for producing a white matrix, and for further producing a color filter and reflective display element.

2. Description of the Related Art

Nowadays, in the development of a flat panel display (FPD), a liquid crystal display is the most widely used for it's thinning and miniaturization. However, watching the liquid crystal display with backlight source for long periods of time usually brings eye fatigue and causes injury to users. The optical characters of liquid crystal display frequently change with the change of viewing angle.

To improve the above-mentioned problems, a reflective display device has been developed. The reflective display device can be more thinner, reduce more power and lighten the burden on user's eye.

The reflective display is a display which uses the incoming ambient light to reflect to display the image, such as a reflective liquid crystal display device and an electronic paper display device, etc.

The electronic paper display device is a new technology, it can transform the words on paper. The above-mentioned "paper" is made up of organic electronic materials actually and it use microspheres which are affected by electric field to display. The pixel transform of the electronic paper display is similar with the person computer, and it refreshs the pages by pixel transform.

The materials of the microsphere of the electronic paper display device include conductive plastics. The pigment of Gyricon Bead was first developed in the 1970s by Xerox. Gyricon Bead is electrostatic microspheres with a black side and a white side. The electrostatic microspheres rotate when the electric fields changed and then could have black, white, gray scale and bring out the display of documents.

In the 1990s, another type of the electronic paper display was invented by Joseph Jacobson at the Massachusetts Institute of Technology (MIT), it used microcapsules instead of the traditional electrostatic microspheres. The microcapsules are filled with color oil and white charged particles. The white particles move up (close to user) or move down (far away from user) via the control of the external electric field. When the white particles move up, it display white and when the white particles move down, it display the color of oil. This type of the electronic paper display device is the application of electrophoresis techniques and the display device could be used to the flexible plastic substrate instead of glass by means of microcapsules.

The color electronic paper display has two ways to display in color: one is using RGB/CYM instead of the white particles and the other is putting a color filter on the electronic paper display device.

A color filter can be produced directly on the glass substrate in a hard electronic paper display device, but the cost is high. To assemble the glass substrate and the color filter in the electronic paper display device is more difficulty. On the other hand, the color filter cannot be produced by the above-mentioned method in a flexible electronic paper display.

Another low-cost method is forming the pattern of the color filter on the display layer of the electronic paper display device. The color filter is made up of photosensitive resins as mentioned in Japanese Patent Publication No. 2009-531727. The pattern of the color filter is formed with a photosensitive resin composition, and the material of the shading part is a black resin composition. However, as to the reflective display using ambient light to display pattern, light transmittance and light utilization efficiency are down and bad brightness.

To improve the above-mentioned problems, Japanese Patent Publication No. 2008-129599 disclose using a white photosensitive resin composition as the shading part. Although this could improve the light utilization efficiency but it has the shortcoming such as poor heat-yellowing resistance, surface roughness resistance, developability and brightness.

Therefore, it still needs to develop a white photosensitive resin composition with good heat-yellowing resistance, surface roughness resistance, developability and brightness to enhance the development of electronic paper display device.

SUMMARY OF THE INVENTION

In the present invention, a specific content of pigment is provided to obtain a photosensitive resin composition having good heat-yellowing resistance, surface roughness resistance, developability and brightness.

Therefore, the invention relates to a photosensitive resin composition comprising:
- a polysiloxane polymer (A);
- a compound having an ethylenically unsaturated group (B);
- a photoinitiator (C);
- a solvent (D);
- a pigment (E); and
- a crosslinking agent (F);
- wherein the pigment (E) comprises at least one selected from the group consisting of titanium dioxide, calcium carbonate, calcium sulfate, zinc oxide, barium sulfate, barium carbonate, silicon dioxide, aluminum powder, kaolin, clay, talc, montmorillonite, aluminum hydroxide, magnesium carbonate, and white hollow polymer microspheres.

The present invention also provides a white matrix formed with the photosensitive resin composition as mentioned above.

The present invention also provides a color filter comprising the white matrix as mentioned above.

The present invention further provides an reflective display element comprising the color filter as mentioned above.

DETAILED DESCRIPTION OF THE INVENTION

Figure 1:
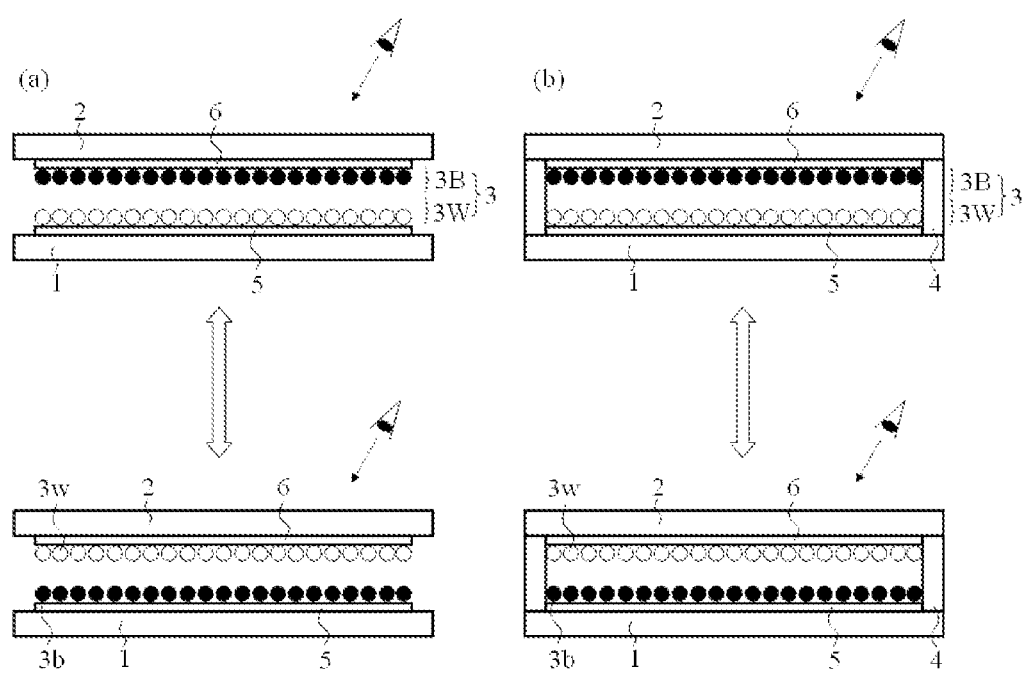
FIGS. 1(a) and (b) show the schematic diagram of the electronic paper display element in the first embodiment of the invention.

The invention relates to a photosensitive resin composition comprising:
- a polysiloxane polymer (A);
- a compound having an ethylenically unsaturated group (B);
- a photoinitiator (C);
- a solvent (D);
- a pigment (E); and
- a crosslinking agent (F);

wherein the pigment (E) comprises at least one selected from the group consisting of titanium dioxide, calcium carbonate, calcium sulfate, zinc oxide, barium sulfate, barium carbonate, silicon dioxide, aluminum powder, kaolin, clay, talc, montmorillonite, aluminum hydroxide, magnesium carbonate, and white hollow polymer microspheres.

There is no specific limitation to the structure of the polysiloxane polymer (A). In one preferred embodiment of the invention, the polysiloxane polymer (A) is obtained by hydrolyzing and condensing a silane compound and/or a polysiloxane; preferably, by partially condensing.

In one preferred embodiment of the invention, the silane compound includes but is not limited to a structure represented by Formula (1);

$$Si(R^a)_z(OR^b)_{4-z} \qquad \text{Formula (1)}$$

wherein:
z represents an integer from 1 to 3; when z represents 2 or 3, the plural $R^a$s are identical with or different from each other; when 4-z represents 2 or 3, the plural $R^b$s are identical with or different from each other;
at least one of $R^a$ is selected from the group consisting of an anhydride-substituted $C_1$-$C_{10}$ alkyl group, an epoxy-substituted $C_1$-$C_{10}$ alkyl group, and an epoxy-substituted alkoxy group, and the rest of $R^a$ is independently selected from the group consisting of hydrogen, a $C_1$-$C_{10}$ alkyl group, a $C_2$-$C_{10}$ alkenyl group, and a $C_6$-$C_{15}$ aryl group, and
$R^b$ is selected from the group consisting of hydrogen, a $C_1$-$C_6$ alkyl group, a $C_1$-$C_6$ acyl group, and a $C_6$-$C_{15}$ aryl group.

Because the polysiloxane polymer (A) according to the invention contains an anhydride group or/and an epoxy group. Therefore, the exposure energy and period for the exposure process can be reduced, and the sensitivity of the photo-curing polysiloxane composition can be enhanced. Acidic groups can be effectively produced so as to benefit the sub sequent development process.

In the definition of $R^a$, the $C_1$-$C_{10}$ alkyl group includes, but is not limited to, methyl, ethyl, n-propyl, isopropyl, n-butyl, tert-butyl, n-hexyl, n-decyl, trifluoromethyl, 3,3,3-trifluoropropyl, 3-aminopropyl, 3-mercaptopropyl, or 3-isocyanatopropyl; the $C_2$-$C_{10}$ alkenyl group includes, but is not limited to, vinyl, 3-acryloxypropyl or 3-methacryloxypropyl; and the $C_6$-$C_{15}$ aryl group includes, but is not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy) pentyl, or naphthyl.

Examples of the anhydride-substituted $C_1$-$C_{10}$ alkyl group include, but are not limited to, ethyl succinic anhydride, propyl succinic anhydride, and propyl glutaric anhydride.

Examples of the epoxy-substituted $C_1$-$C_{10}$ alkyl group include, but are not limited to, oxetanylpentyl, and 2-(3,4-epoxycyclohexyl)ethyl.

Examples of the epoxy-substituted alkoxy group include, but are not limited to, glycidoxypropyl, and 2-oxetanylbutoxy.

In the definition of $R^b$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

Examples of the silane monomer represented by Formula (1) include, but are not limited to, 3-glycidoxypropyltrimethoxysilane (abbreviated as TMS-GAA), 3-glycidoxypropyltriethoxysilane, 2-(3,4-epoxycyclohexyl)ethyltrimethoxysilane, and 2-oxetanylbutoxypropyltriphenoxysilane; commercially available products manufactured by Toagosei Co., Ltd., for example, 2-oxetanylbutoxypropyltrimethoxysilane (trade name: TMSOX-D), 2-oxetanylbutoxypropyltriethoxysilane (trade name: TESOX-D), and 3-triphenoxysilyl propyl succinic anhydride; commercially available products manufactured by Shin-Etsu Chemical Co., Ltd., for example, 3-trimethoxysilyl propyl succinic anhydride (trade name: X-12-967); commercially available products manufactured by Wacker Chemie AG, for example, 3-(triethoxysilyl) propyl succinic anhydride (trade name: GF-20), 3-(trimethoxysilyl) propyl glutaric anhydride (abbreviated as TMSG), 3-(triethoxysilyl) propyl glutaric anhydride, 3-(triphenoxysilyl) propyl glutaric anhydride, diisopropoxy-di(2-oxetanylbutoxypropyl)silane (abbreviated as DIDOS), di(3-oxetanylpentyl)dimethoxy silane, (di-n-butoxysilyl) di(propyl succinic anhydride), (dimethoxysilyl) di(ethyl succinic anhydride), 3-glycidoxypropyldimethylmethoxysilane, 3-glycidoxypropyldimethylethoxysilane, di(2-oxetanylbutoxypentyl)-2-oxetanylpentylethoxy silane, tri(2-oxetanylpentyl)methoxy silane, (phenoxysilyl) tri(propyl succinic anhydride), and (methylmethoxysilyl) di(ethyl succinic anhydride).

Preferably, the silane monomer includes a silane monomer represented by Formula (2):

$$Si(R^c)_u(OR^d)_{4-u} \qquad \text{Formula (2)}$$

wherein:
$R^c$ represents a hydrogen atom, a $C_1$-$C_{10}$ alkyl group, a $C_2$-$C_{10}$ alkenyl group, or a $C_6$-$C_{15}$ aryl group; plural $R^c$s being identical with or different from each other when u is 2 or 3;
$R^d$ represents a hydrogen atom, a $C_1$-$C_6$ alkyl group, a $C_1$-$C_6$ acyl group, or a $C_6$-$C_{15}$ aryl group; and
u is an integer ranging from 0 to 3; when u represents 2 or 3, the plural $R^c$s are identical with or different from each other; when 4-u represents 2 or 3, the plural $R^d$s are identical with or different from each other.

In the definition of $R^c$, the $C_1$-$C_{10}$ alkyl group includes, but is not limited to, methyl, ethyl, n-propyl, isopropyl, n-butyl, tert-butyl, n-hexyl, n-decyl, trifluoromethyl, 3,3,3-trifluoropropyl, 3-aminopropyl, 3-mercaptopropyl, or 3-isocyanatopropyl; the $C_2$-$C_{10}$ alkenyl group includes, but is not limited to, vinyl, 3-acryloxypropyl or 3-methacryloxypropyl; and the $C_6$-$C_{15}$ aryl group includes, but is not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy) pentyl, or naphthyl.

In the definition of $R^d$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

Examples of the silane monomer represented by Formula (2) include, but are not limited to, tetramethoxysilane, tetraethoxysilane, tetraacetoxysilane, tetraphenoxy silane, methyltrimethoxysilane (abbreviated as MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, phenyltrimethoxysilane (abbreviated as PTMS), phenyltriethoxysilane (abbreviated as PTES), p-hydroxyphenyltrimethoxysilane, 1-(p-hydroxyphenyl)ethyltrimethoxysilane, 2-(p-hydroxyphenyl)

ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, dimethyldimethoxysilane (abbreviated as DMDMS), dimethyldiethoxysilane, dimethyldiacetyloxysilane, di-n-butyldimethoxysilane, diphenyldimethoxysilane, trimethylmethoxysilane, tri-n-butylethoxysilane, 3-mercaptopropyltrimethoxysilane, 3-acryoyloxypropyltrimethoxysilane, 3-methylacryloyloxypropyltrimethoxysilane, and 3-methylacryloyloxypropyltriethoxysilane. The aforesaid examples of the siloxane monomer represented by Formula (2) can be used alone or as a mixture of two or more.

Preferably, the silane monomer includes a siloxane prepolymer of Formula (3):

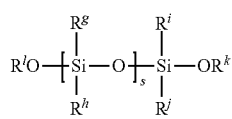

Formula (3)

wherein:

$R^g$, $R^h$, $R^i$ and $R^j$ independently represent a hydrogen atom, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group;

s is an integer ranging from 1 to 1,000, preferably from 3 to 300, and more preferably from 5 to 200; when s represents 2 to 1000, the plural $R^g$s and the plural $R^h$s are identical with or different from each other.

Examples of the $C_1$-$C_{10}$ alkyl group include, but are not limited to, methyl, ethyl, and n-propyl. Examples of the $C_2$-$C_6$ alkenyl group include, but are not limited to, vinyl, acryloxypropyl, and methacryloxypropyl. Examples of the $C_6$-$C_{15}$ aryl group include, but are not limited to, phenyl, tolyl, and naphthyl.

$R^i$ and $R^k$ independently represent a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the $C_1$-$C_6$ alkyl group include, but are not limited to, methyl, ethyl, n-propyl, iso-propyl, and n-butyl. A non-limiting example of the $C_1$-$C_6$ acyl group is acetyl. A non-limiting example of the $C_6$-$C_{15}$ aryl group is phenyl.

Examples of the siloxane prepolymer represented by Formula (3) include, but are not limited to, 1,1,3,3-tetramethyl-1,3-dimethoxy disiloxane, 1,1,3,3-tetramethyl-1,3-diethoxydisiloxane, 1,1,3,3-tetraethyl-1,3-diethoxydisiloxane, and commercially available silanol terminal polysiloxanes manufactured by Gelest Inc. (for example, DM-S 12 (molecular weight: 400-700), DMS-S15 (molecular weight: 1,500-2,000), DMS-S21 (molecular weight: 4,200), DMS-S27 (molecular weight: 18,000), DMS-S31 (molecular weight:26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or as a mixture of two or more.

In one another preferred embodiment of the invention, besides of obtained by hydrolyzing and condensing a silane compound and/or a polysiloxane, the polysiloxane polymer (A) can also be prepared via a copolymerization by mixing the silane compound and/or polysiloxane with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include, but are not limited to, commercially available products manufactured by JGC Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), and the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), and the like; and commercially available products manufactured by Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), and the like. The aforesaid examples of the silicon dioxide particles can be used alone or as a mixture of two or more.

The condensation can be conducted in a manner well known in the art. For example, a solvent, water, and optionally a catalyst are added to the silane monomer component, followed by stirring at a temperature ranging from 50° C. to 150° C. for 0.5 hour to 120 hours. During stirring, the by-products, such as alcohols, water, and the like, can be removed by distillation, if necessary.

There is no specific limitation to the solvent, which can be identical with or different from the solvent (D) contained in the photosensitive resin composition. Preferably, the solvent is used in an amount ranging from 15 g to 1,200 g, preferably from 20 g to 1,100 g, and more preferably from 30 g to 1,000 g based on 100 g of the silane monomer component.

The amount of water for the hydrolysis ranges from 0.5 mole to 2 moles based on 1 mole of the hydrolyzable groups contained in the silane monomer.

There is no specific limitation to the catalyst, and an acid catalyst or a base catalyst can be preferably used. Examples of the acid catalyst include, but are not limited to, hydrochloric acid, nitric acid, sulfuric acid, hydrofluoric acid, oxalic acid, phosphoric acid, acetic acid, trifluoroacetic acid, formic acid, polycarboxylic acids and anhydrides thereof, and ion exchange resins. Examples of the base catalyst include, but are not limited to, diethylamine, triethylamine, tripropylamine, tributylamine, tripentylamine, trihexylamine, triheptylamine, trioctylamine, diethanolamine, triethanolamine, sodium hydroxide, potassium hydroxide, and alkoxysilanes containing an amino group.

Preferably, the catalyst is used in an amount ranging generally from 0.005 g to 15 g, preferably from 0.01 g to 12 g, and more preferably from 0.05 g to 10 g based on 100 g of the silane monomer.

In view of storage stability, it is preferable that the by-products (for example, alcohols and water) and the catalyst are not contained in the polysiloxane polymer (A) produced after condensation. Therefore, it is preferable to purify the polysiloxane polymer (A). There is no specific limitation to the purification method. Preferably, the polysiloxane polymer (A) is diluted with a hydrophobic solvent, and an organic layer washed with water several times is then concentrated with an evaporator to remove alcohols or water. Additionally, the catalyst can be removed using ion exchange resin.

While not wishing to be limited by theory, it is Applicant's belief that because the basic nature of the polysiloxane polymer is more heat-resistant, adding the polysiloxane polymer can enhance the heat resistance of the photosensitive resin composition and further avoid the pyrolysis generated heat-yellowing. If the polysiloxane polymer (A) is absent, the heat-yellowing occurs. Preferably, the polysiloxane polymer (A) comprises at least one anhydride-substituted $C_1$-$C_{10}$ alkyl group, epoxy-substituted $C_1$-$C_{10}$ alkyl group, or epoxy-substituted alkoxy group, and the developability can be further improved.

The polysiloxane polymer (A) can comprises an other alkali-soluble resin. The other alkali-soluble resin comprises but is not limited to a resin containing a carboxyl group or a hydroxyl group. Examples are an acrylic resin, a fluorene resin, an urethane resin or a novolac resin.

In one preferred embodiment of the invention, the acrylic resin is obtained by copolymerizing an unsaturated compound having one or more carboxyl groups or anhydride groups and/or other unsaturated compound in a solvent in the presence of a proper initiator.

Examples of the aforementioned unsaturated compound having one or more carboxyl groups or anhydride groups include, but are not limited to, unsaturated monocarboxylic acids, such as acrylic acid (abbreviated as AA), methacrylic acid, butenoic acid, α-chloroacrylic acid, ethacrylic acid, cinnamic acid, 2-acryloylethoxy succinate, 2-methacryloylethoxy succinate (abbreviated as HOMS), 2-isobutyrylethoxy succinate, or the like; unsaturated dicarboxylic acids and/or anhydrides thereof, such as maleic acid, maleic anhydride, fumaric acid, itaconic acid, itaconic anhydride, citraconic acid, citraconic anhydride, or the like; and unsaturated polycarboxylic acids having at least three carboxyl groups in the molecules and/or anhydrides thereof; or the like. Preferably, the unsaturated compound having one or more carboxyl groups or anhydride groups is selected from acrylic acid, methacrylic acid, 2-acryloylethoxy succinate, 2-methacryloylethoxy succinate and 2-isobutyrylethoxy succinate. The unsaturated compound having one or more carboxyl groups or anhydride groups can be used alone or as a mixture of two or more for increasing the pigment dispersion, enhancing the development speed, and reducing the residue.

Examples of the other unsaturated compound include, but are not limited to, vinyl aromatic compounds, such as styrene (abbreviated as SM), α-methyl styrene, vinyl toluene, p-chlorostyrene, methoxystyrene, or the like; maleimides, such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide, or the like; unsaturated carboxylates, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate (abbreviated as BzMA), phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate, dicyclopentenyloxyethyl acrylate (abbreviated as DCPOA), or the like; unsaturated amino alkyl carboxylates, such as N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, N-isobutyl aminopropyl acrylate, or the like; unsaturated glycidyl carboxylates, such as glycidyl acrylate, glycidyl methacrylate (abbreviated as GMA), or the like; vinyl carboxylates, such as vinyl acetate, vinyl propionate, vinyl butyrate, or the like; unsaturated ethers, such as vinyl methyl ether, vinyl ethyl ether, allyl glycidyl ether, methallyl glycidyl ether, or the like; vinyl cyanides, such as acrylonitrile, methyl acrylonitrile, α-chloroacrylonitrile, vinylidene cyanide, or the like; unsaturated amides, such as acrylamide, methacrylamide, α-chloroacrylamide, N-hydroxyethyl acrylamide, N-hydroxyethyl methacrylamide, or the like; and aliphatic conjugate dienes, such as 1,3-butadiene, iso-propylene, chloroprene, or the like.

Preferably, the other unsaturated compound is selected from styrene, N-phenylmaleimide, methyl acrylate, methyl methacrylate, 2-hydroxyethyl acrylate, 2-hydroxyethyl methacrylate, benzyl acrylate, benzyl methacrylate, and dicyclopentenyloxyethyl acrylate. The aforesaid examples of the other unsaturated compound can be used alone or in admixture of two or more thereof.

Preferably, 50 to 95 parts by weight of the unsaturated compound having one or more carboxyl groups or anhydride groups and 5 to 50 parts by weight of the other unsaturated compound used in the copolymerization reaction based on 100 parts by weight of the sum of the unsaturated compound having one or more carboxyl groups or anhydride groups and the other unsaturated compound.

In another aspect, examples of the solvent suitable for preparing the acrylic resin include, but are not limited to, (poly)alkylene glycol monoalkyl ethers, such as ethylene glycol methyl ether (abbreviated as EGMME), ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-oxobutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol methyl ether acetate and ethyl 3-ethoxypropionate. The aforesaid examples of the solvent can be used alone or in admixture of two or more thereof.

Furthermore, the initiator used for preparing the acrylic resin (A-2) is a free radical polymerization initiator, examples of which include, but are not limited to, azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methyl butyronitrile, or the like; and peroxides, such as benzoyl peroxide, or the like.

According to the invention, examples of the fluorene resin are V259ME, V259MEGTS or V500MEGT (manufactured by NIPPON STEEL & SUMIKIN CHEMICAL CO., LTD). The aforesaid examples of the fluorene resin can be used alone or in admixture of two or more thereof.

According to the invention, examples of the urethane resin are UN-904, UN-952, UN-333 or UN1255 (manufactured by Negami Chemical Industrial Co., Ltd). The aforesaid examples of the urethane resin can be used alone or in admixture of two or more thereof.

According to the invention, examples of the novolac resin are EP4020G, EP4080G, TR40B45G or EP30B50 (manufactured by Asahi Organic Chemical Industry Co., Ltd). The aforesaid examples of the novolac resin can be used alone or in admixture of two or more thereof.

The compound having an ethylenically unsaturated group (B) according to the present invention is a compound having at least one ethylenically unsaturated group.

Examples of the compound having an ethylenically unsaturated group include, but are not limited to, acrylamide, (meth)acryloylmorpholine, 7-amino-3,7-dimethyloctyl (meth)acrylate, iso-butoxymethyl (meth)acrylamide, iso-bornyloxyethyl (meth)acrylate, iso-bornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth)acrylate, dodecyl (meth) acrylate, dicyclopentenyloxyethyl (meth)acrylate, dicyclopentenyl (meth)acrylate, N,N-dimethyl (meth)acrylamide, tetrachlorophenyl (meth)acrylate, 2-tetrachlorophenoxy ethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidone, phenoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate, or like.

Examples of the compound having two or more ethylenically unsaturated groups include, but are not limited to, ethylene glycol di(meth)acrylate, dicyclopentenyl di(meth)acrylate, triethylene glycol diacrylate, tetraethylene glycol di(meth)acrylate, tri(2-hydroxyethyl) isocyanate di(meth) acrylate, tri(2-hydroxyethyl) isocyanate tri(meth)acrylate, caprolactone-modified tri(2-hydroxyethyl) isocyanate tri (meth)acrylate, trimethylolpropyl tri(meth)acrylate, ethylene oxide (hereinafter abbreviated as EO) modified trimethylolpropyl tri(meth)acrylate, propylene oxide (hereinafter abbreviated as PO) modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether (meth) acrylate, or the like.

Preferably, the compound having an ethylenic group is selected from trimethylolpropyl triacrylate, EO-modified trimethylolpropyl triacrylate, PO-modified trimethylolpropyl triacrylate, pentaerythritol triacrylate, pentaerythritol tetracrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, and PO-modified glycerol triacrylate. The aforesaid examples of the compound having an ethylenic group can be used alone or in admixture of two or more thereof.

Preferably, the used amount of the compound having an ethylenically unsaturated group (B) is from 30 to 300 parts by weight based on 100 parts by weight of used amount of the polysiloxane polymer (A); more preferably, the used amount of the compound having an ethylenically unsaturated group (B) is from 40 to 250 parts by weight; still more preferably, the used amount of the compound having an ethylenically unsaturated group (B) is from 50 to 200 parts by weight.

The photoinitiator (C) comprises an O-oxime photoinitiator represented by Formula (C-1), a triazine photoinitiator, an acetophenone photoinitiator, a biimidazole photoinitiator, or a benzophenone photoinitiator.

Formula (C-1)

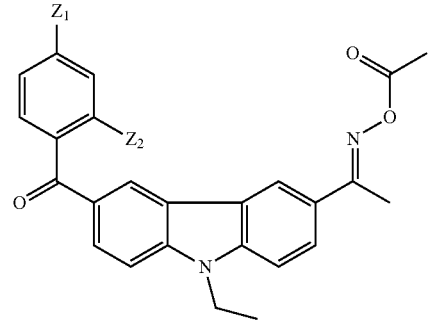

wherein:
$Z_1$ represents $R_m$, $R_n$—S or $R_o$—O, wherein $R_m$, $R_n$, $R_o$ independently represents a hydrogen atom, an alkyl or aryl group; $Z_2$ represents a hydrogen atom, a $C_1$-$C_4$ alkyl group or a halide.

Examples of the O-oxime photoinitiator are 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazole-3-yl]-ethanone 1-(O-acetyloxime), 1-[9-ethyl-6-(3-methylbenzoyl)-9H-carbazole-3-yl]-ethanone 1-(O-acetyloxime), 1-[9-ethyl-6-benzoyl-9H-carbazole-3-yl]-ethanone 1-(O-acetyloxime), ethanone-1-[9-ethyl-6-(2-methyl-4-tetrahydrofuranylbenzoyl)-9H-carbazole-3-yl]-1-(O-acetyloxime), ethanone-1-[9-ethyl-6-(2-methyl-4-tetrahydropyranylbenzoyl)-9H-carbazole-3-yl]-1-(O-acetyloxime), ethanone-1-[9-ethyl-6-(2-methyl-5-tetrahydrofuranylbenzoyl)-9H-carbazole-3-yl]-1-(O-acetyloxime), ethanone-1-[9-ethyl-6-(2-methyl-5-tetrahydropyranylbenzoyl)-9H-carbazole-3-yl]-1-(O-acetyloxime), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-(2-methyl-4-tetrahydropyranylmethoxybenzoyl)-9H-carbazole-3-yl]-1-(O-acetyloxime), ethanone-1-[9-ethyl-6-(2-methyl-5-tetrahydrofuranylmethoxybenzoyl)-9H-carbazole-3-yl]-1-(O-acetyloxime), ethanone-1-[9-ethyl-6-(2-methyl-5-tetrahydropyranylmethoxybenzoyl)-9H-carbazole-3-yl]-1-(O-acetyloxime), ethanone-1-[9-ethyl-6-{2-methyl-4-(2,2-dimethyl-1,3-dioxolanyl)benzoyl}-9H-carbazole-3-yl]-1-(O-acetyloxime), and ethanone-1-[9-ethyl-6-{2-methyl-4-(2,2-dimethyl-1,3-dioxolanyl)methoxybenzoyl}-9H-carbazole-3-yl]-1-(O-acetyloxime).

Examples of the triazine photoinitiator are 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(tri-chloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenypaminophenyl]-2,6-di(trichloromethyl)-s-triazine, 4-[p-N-chloroethylcarbonylaminophenyl]-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, 2,4-bis(trichloromethyl)-6-p-methoxystyryl-s-triazine, and 2,4-bis(trichloromethyl)-6-[3-bromo-4-[N,N-di(ethoxycarbonylmethyl)amino]-phenyl]-1,3,5-triazine.

Examples of the acetophenone photoinitiator are p-dimethylamino-acetophenone, α,α'-dimethoxyazoxyacetophenone, 2,2'-dimethyl-2-phenylacetophenone, p-methoxyacetophenone, 2-methyl-1-(4-methylthio phenyl)-2-morpholino propane-1-on, and 2-benzyl-2-N,N-dimethylamino-1-(4-morpholinophenyl)-1-butanone.

Examples of the biimidazole photoinitiator are 2,2'-bis(o-chlorophenyl)-4,4',5,5'-tetraphenyl-biimidazole, 2,2'-bis(o-fluorophenyl)-4,4',5,5'-tetraphenyl biimidazole, 2,2'-bis(o-methyl phenyl)-4,4',5,5'-tetraphenyl biimidazole, 2,2'-bis(o-methoxyphenyl)-4,4',5,5'-tetraphenylbiimidazole, 2,2'-bis(o-ethylphenyl)-4,4',5,5'-tetraphenyl biimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenyl biimidazole, and 2,2'-bis(2,4-dichlorophenyl)-4,4',5,5'-tetraphenylbiimidazole.

Examples of the benzophenone photoinitiator are thioxanthone, 2,4-diethylthioxanthanone, thioxanthone-4-sulfone, benzophenone, 4,4'-bis(dimethylamino)benzophenone, and 4,4'-bis(diethylamino)benzophenone.

Preferably, the photoinitiator is 1-[4-(phenylthio)phenyl]-octane-1,2-dione 2-(O-benzoyloxime), 1-[9-ethyl-6-(2-methylbenzoyl)-9H-carbazole-3-yl]-ethanone 1-(O-acetyloxime), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-{2-methyl-4-(2,2-dimethyl-1,3-dioxolanyl)methoxybenzoyl}-9H-carbazole-3-yl]-1-(O-acetyloxime), 4-[m-bromo-p-N,N-di(ethoxycarbonylmethyl)aminophenyl]-2,6-di(trichloromethyl)-s-triazine, 2,4-bis(trichloromethyl)-6-p-methoxystyryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, and 4,4'-bis(diethylamino)benzophenone.

Additionally, the photosensitive resin composition according to the invention further comprises a photoinitiator besides the aforementioned photoinitiator as needed without changing the properties. Examples are an α-diketone compound, an acyloin compound, an acylphosphineoxide compound a quinine compound, a halide compound, and a peroxide compound.

Examples of the α-diketone compound are benzil, acetyl, or the like; examples of acyloin compound are benzoin, or the like; examples of the acyloin ether compound are benzoin methyl ether, benzoin ethyl ether, benzoin isopropyl ether, or the like; examples of the acylphosphineoxide compound are 2,4,6-trimethylbenzoyl diphenylphosphine oxide, bis-(2,6-dimethoxybenzoyl)-2,4,4-trimethyl benzyl phosphine oxide, or the like; examples of the quinone compound are anthraquinone, 1,4-naphthoquinone, or the like; examples of the halide compounds are phenacyl chloride, tribromomethyl phenylsulfone, tris(trichloromethyl)-s-triazine, or the like; and examples of the peroxide compounds are di-tert-butyl peroxide; or the like.

The aforesaid examples of the photoinitiator can be used alone or as a mixture of two or more.

In one embodiment of the invention, the used amount of the photoinitiator (C) is from 10 to 60 parts by weight based on 100 parts by weight of the used amount of the compound having an ethylenically unsaturated group (B); preferably is from 12 to 55 parts by weight; more preferably is from 15 to 50 parts by weight.

The solvent (D) according to the invention can be chosen by skilled artisans in this field. Any solvents, which are inert to and can disperse or dissolve the polysiloxane polymer (A), the compound having an ethylenically unsaturated group (B), the photoinitiator (C), and the crosslinking agent (F), and which have appropriate volatility, can be used.

The solvent (D) includes, but is not limited to, (poly)alkylene glycol monoalkyl ethers, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, 4-hydroxy-4-methyl-2-pentanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-oxobutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol ethyl ether and 4-hydroxy-4-methyl-2-pentanone. The aforesaid examples of the solvent can be used alone or in admixture of two or more thereof.

In one embodiment of the invention, the used amount of the solvent (D) is from 200 to 1500 parts by weight based on 100 parts by weight of the used amount of the polysiloxane polymer (A); preferably from 250 to 1300 parts by weight; more preferably from 300 to 1000 parts by weight.

The pigment (E) according to the invention comprises at least one selected from the group consisting of titanium dioxide, calcium carbonate, calcium sulfate, zinc oxide, barium sulfate, barium carbonate, silicon dioxide, aluminum powder, kaolin, clay, talc, montmorillonite, aluminum hydroxide, magnesium carbonate, and white hollow polymer microspheres.

If the pigment (E) is absent in the photosensitive resin composition according to the invention, the light transmittance of the pattern formed therefrom is too high, and it leads the problem of poor reflectivity.

The aforesaid examples of the pigment (E) can be used alone or in admixture of two or more thereof.

As needed, the pigment (E) is accompanied by using a dispersing agent, such as a cationic, anionic, nonionic, amphoteric, fluorine-based or silicone-based surfactant. Examples of the surfactant are polyoxyethylene alkyl ethers, such as polyoxyethylene dodecyl ether, polyoxyethylene stearyl ether and polyoxyethylene oleyl ether; polyoxyethylene phenyl ethers, such as polyoxyethylene n-octyl phenyl ether and polyoxyethylene n-nonylphenyl ether; polyoxyethylene dialkyl esters, such as polyoxyethylene dilaurate and polyoxyethylene distearate; sorbitol anhydride fatty acid esters; fatty acid modified polyesters; tertiary amine modified poly-amino acid esters; KP products of Shin-Etsu Chemical Industries, Ltd., SF-8427 manufactured by Toray Dow Corning Silicon, Polyflow products manufactured by Kyoeisha Yushi Kagaku Kogyo, F-Top product manufactured by Tochem Products Co., Ltd., Megafac products manufactured by Japanese ink chemical industry, Fluorade manufactured by Sumitomo 3M, Asahi Guard manufactured by Asahi Glass Company, Surflon manufactured by Asahi Glass Company.

In one embodiment of the invention, the used amount of the pigment (E) is from 100 to 600 parts by weight based on 100 parts by weight of the used amount of the polysiloxane polymer (A); preferably from 120 to 550 parts by weight; more preferably from 150 to 500 parts by weight. If the pigment (E) is absent, poor reflectivity occurs.

The photosensitive resin composition comprising the crosslinking agent (F) to improve the heat resistance and chemical resistance of the cured film. The crosslinking agent (F) according to the present invention is not particularly limited, provided that it is thermal crosslinking agent that can conduct a crosslinking reaction during baking after exposure and development.

In one embodiment of the invention, the crosslinking agent (F) comprises an epoxy-containing compound (F-1). Preferably, the epoxy-containing compound (F-1) is selected from the group consisting of (poly)glycidyl ether (F-1-1) obtained by reacting a monohydroxy compound or a polyhydroxy compound with epichlorohydrin; (poly)glycidyl ester (F-1-2) obtained by reacting a (poly) carboxylic acid compound with epichlorohydrin; (poly)glycidyl amine (F-1-3) obtained by reacting a (poly) amine compound with epichlorohydrin; and other epoxy-containing compound (F-1-4).

Examples of the (poly)glycidyl ether (F-1-1) are glycidyl ether resins such as diglycidyl ether type epoxy of polyethylene glycol, diglycidyl ether type epoxy of bis(4-hydroxyphenyl), diglycidyl ether type epoxy of bis(3,5-dimethyl-4-hydroxyphenyl), diglycidyl ether type epoxy of Bisphenol F, diglycidyl ether type epoxy of Bisphenol A, diglycidyl ether type epoxy of tetramethyl bisphenol A, diglycidyl ether type epoxy of Bisphenol A ethylene oxide adduct, dihydroxylfluorene type epoxy, dihydroxyl alkyleneoxyl fluorene type epoxy, aldehyde novolac type epoxy, phenol novolac type epoxy, or cresol novolac type epoxy; and phenolic epoxy resins such as Bisphenol S epoxy resin, phenol novolac epoxy resin, cresol novolac epoxy resin, tris-phenol epoxy resin, epoxy resin polymerized by dicyclopentadiene and phenol, and epoxy resin polymerized by phenol and naphthalene. The aforesaid examples of the (poly)glycidyl ether (F-1-1) can be used alone or in admixture of two or more thereof.

Preferably, a carboxyl group can be introduced by reacting a residual hydroxyl group and acid anhydride or a bivalent carboxylic acid compound in the (poly)glycidyl ether (F-1-1).

Examples of the (poly)glycidyl ester (F-1-2) are glycidyl ester type epoxy resins such as diglycidyl ester type epoxy resin of hexahydrophthalic acid or diglycidyl ester type epoxy resin of phthalic acid. The aforesaid examples of the (poly)glycidyl ester (F-1-2) can be used alone or in admixture of two or more thereof.

Examples of the (poly)glycidyl amine (F-1-3) are diglycidyl amine type epoxy resin of bis(4-aminophenyl) methane or triglycidyl amine type epoxy resin of isocyanuric acid. The aforesaid examples of the (poly)glycidyl amine (F-1-3) can be used alone or in admixture of two or more thereof.

Examples of the other epoxy-containing compound (F-1-4) are those polymerized by (meth)acrylate containing an epoxy group alone or in admixture of two or more thereof.

Examples of the (meth)acrylate containing an epoxy group are glycidyl (meth)acrylate, α-ethyl glycidyl acrylate, α-n-propyl glycidyl acrylate, α-n-butyl glycidyl acrylate, 3,4-epoxybutyl (meth)acrylate, 4,5-epoxypentyl (meth)acrylate, 6,7-epoxyheptyl (meth)acrylate, or α-ethyl 6,7-epoxyhepty acrylate; preferably is glycidyl (meth)acrylate.

In one embodiment of the invention, the content of the structure unit of the (meth)acrylate containing an epoxy group and other copolymerized monomer is generally 10 to 70 mole % mole; preferably from 15 mole % to 60 mole %.

According to the invention, examples of the other copolymerized monomer are (meth)acrylate such as (meth)acrylate, methyl (meth)acrylate, ethyl (meth)acrylate, butyl (meth) acrylate, 2-ethylhexyl (meth)acrylate, phenyl (meth)acrylate, cyclohexyl (meth)acrylate, dicyclopentanyl (meth)acrylate, dicyclopentanyl ethoxyl (meth)acrylate, or isobornyl (meth) acrylate; vinyl aromatic compounds such as styrene, α-methyl styrene, p-methyl styrene, and naphthyl; preferably, the other copolymerizable monomer is dicyclopentanyl (meth) acrylate or α-styrene.

In one embodiment of the invention, the used amount of the epoxy-containing compound (F-1) is from 5 to 60 parts by weight based on 100 parts by weight of the used amount of the polysiloxane polymer (A); preferably is from 8 to 50 parts by weight; more preferably is from 10 to 40 parts by weight. Applying the epoxy-containing compound (F-1) can further improve the surface roughness resistance and developability.

In one embodiment of the invention, the crosslinking agent (F) further comprises a nitrogen-containing compound (F-2). Examples of the nitrogen-containing compound (F-2) are a compound obtained by reacting melamine, benzoguanamine, urea or glycoluril and formaldehyde, or the compound thereof modified by an alkyl group or acrylic acid.

Examples of the compound obtained by reacting melamine and formaldehyde or the compound thereof modified by an alkyl group or acrylic acid are CYMEL 300, 301, 303, 350, 736, 738, 370, 771, 325, 327, 703, 701, 266, 267, 285, 232, 235, 238, 1141, 272, 254, 202, 1156 or 1158 (manufactured by Mitsui Chemicals, Inc.), NIKALAC E-2151, MW-100LM, MX-750LM (manufactured by Sanwa Chemistry Co., Ltd).

Examples of the compound obtained by reacting benzoguanamine and formaldehyde or the compound thereof modified by an alkyl group or acrylic acid are CYMEL 1123, 1125 and 1128.

Examples of the compound obtained by reacting glycoluril and formaldehyde or the compound thereof modified by an alkyl group or acrylic acid are CYMEL 1170, 1171, 1174, 1172, and NIKALAC MX-270.

Examples of the compound obtained by reacting urea and formaldehyde or the compound thereof modified by an alkyl group or acrylic acid are UFR65, 300 (manufactured by Mitsui Chemicals, Inc.), NIKALAC MX-290.

In one embodiment of the invention, the used amount of the crosslinking agent (F) is from 10 to 60 parts by weight based on 100 parts by weight of the used amount of the polysiloxane polymer (A); preferably is from 13 to 50 parts by weight; more preferably is from 15 to 40 parts by weight. If the crosslinking agent (F) is absent, the surface roughness resistance and developability are poor.

While not wishing to be limited by theory, it is Applicant's belief that because the cross-linked crosslinking agent cannot be dissolved in an alkaline developer, the developability is improved. Furthermore, the resin softens after post-baking, the surface roughness can be improved.

Preferably, the photosensitive resin composition according to the present invention can contain additives (G) according to the specific requirements for the physical and/or chemical properties. The additives can be chosen by skilled artisans in the field. Examples of the additives (G) are fillers, polymers other than the polysiloxane polymer (A), adhesion improving agents, antioxidants, UV absorbents, anti-coagulants, or the like.

Examples of the additives (G) are the fillers such as glass, alumina; polymers other than the polysiloxane polymer (A) such as polyvinyl alcohol, polyethylene glycol monoalkyl ether, polyfluoro alkyl acrylate; adhesion improving agents such as vinyltrycholorosilane, vinyltriethoxysilane, vinyltris (β-methoxyethoxy)silane, β-(3,4-epoxycyclohexyl)ethyltrimethoxysilane, 3-glycidyloxypropyltrimethoxysilane, γ-glycidyloxypropylmethyldimethoxysilane, γ-(meth) acryloylpropyltrimethoxysilane, N-(β-aminoethyl)-γ-aminopropyl trimethoxysilane, N-(β-aminoethyl)-γ-aminopropyltrimethyldimethoxysilane, N-phenyl-γ-aminopropyltrimethoxysilane, γ-chloropropyltrimethoxysilane, γ-mercaptopropyltrimethoxysilane, γ-aminopropyltrimethoxysilane, and bis-1,2-(trimethoxysilyl)ethane; antioxidants such as 2,2-thiobis(4-methyl-6-t-butylphenol), 2,6-di-t-butylphenol; UV absorbents such as 2-(3-t-butyl-5-methyl-2-hydroxyphenyl)-5-chlorobenzotriazole, alkoxybenzophenone; or anti-coagulants such as sodium polyacrylate.

In one embodiment of the invention, the used amount of the additives (G) is from 0 to 10 parts by weight based on 100 parts by weight of the used amount of the polysiloxane polymer (A); preferably is from 0 to 6 parts by weight; more preferably is from 0 to 3 parts by weight.

In another aspect, in order to improve coating, the photosensitive resin composition comprises an surfactant. In one embodiment of the invention, the used amount of the surfactant is from 0 to 6 parts by weight based on 100 parts by weight of the used amount of the polysiloxane polymer (A); preferably is from 0 to 4 parts by weight; more preferably is from 0 to 3 parts by weight. Examples of the aforementioned surfactant are the same to the surfactants used accompanied with the pigment (E), and are not repeated again.

The present invention also provides a white matrix formed with the photosensitive resin composition as mentioned above.

In one embodiment of the invention, the white matrix of the present invention is formed by coating the photosensitive resin composition onto a transparent substrate followed by pre-bake, exposure, development, and post-bake treatments. In one embodiment of the present invention, said transparent substrate refers to glass or resin substrate, and preferably glass substrate such as soda-lime glass, alkali-free glass, pyrex glass, quartz glass, and the glass covered by a transparent conductive film. Examples of said resin substrate are as follows: polyimide, polycarbonate, polymethylmethacrylate, or polyethylene terephthalate. The transparent substrate may be subjected to suitable pre-treatment, for example, chemical treatment with a silane crosslinking agent, plasma treatment, ion plating, sputtering, vapor depositing or vacuum vapor depositing.

The manner for manufacturing the white matrix by applying the photosensitive resin composition according to the invention can be coated on the substrate by a spin coating method, a cast coating method, an ink-jet coating method, or a roller coating method. After coating, the composition is dried under reduced pressure to remove most of the solvent. After completely evaporating the residual solvent by pre-baking, a pre-baking film is formed. Operation conditions for the drying under reduced pressure and the pre-baking depend on kinds and amounts of the components used in the photosensitive resin composition. In general, the drying under reduced pressure is carried out at a pressure from 0 to 200 mm Hg for a period from 1 to 60 seconds. The pre-baking is carried out at a temperature from 70° C. to 110° C. for a period from 1 to 15 minutes. The coating film is then exposed to UV light through a specific photo mask, and is developed in a developer solution at a temperature of 23±2° C. for a period from 15 seconds to 5 minutes to dissolve and remove the unexposed portions of the coating film so as to obtain a desired pattern. Preferably, the UV light used for the exposure of the coating film can be g line, h line, i line, or the like. The UV lamp for providing the UV light is a (ultra)high-pressure mercury lamp or a metal halide lamp.

In one preferred embodiment of the invention, the developer solution is sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diaza-bicyclo(5,4,0)-7-undecene, or the like. The concentration of the developer in the solution is from 0.001 wt % to 10 wt %, preferably from 0.005 wt % to 5 wt %, and more preferably from 0.01 wt % to 1 Wt %.

When applying the alkali developer, the substrate with the desired pattern of the coating film is washed with water after the development, and then dried with compressed air or compressed nitrogen.

The substrate containing the coating film after drying is heated at a temperature from 100 to 280° C. for a period of 1 to 15 minutes to remove the evaporated contents in the film. The unreacted ethylenically unsaturated double bonds in the film also undergo a thermosetting reaction. The white matrix is obtained thereby.

The present invention also provides a color filter comprising the white matrix as mentioned above.

The color filter according to the present invention is produced by forming the white matrix on the substrate, and then in the same manner, photosensitive resin compositions with colors (including red, green, and blue) are formed on the predetermined pixels on the repeated three-times steps of the same operation to obtained a pixel colored layer of the color filter. Second, after the pixel colored layer is formed on the ITO (indium tin oxide) deposited film, etching and wiring the ITO deposited film if necessary to obtain the color filter of the reflective display device.

The invention further provides an reflective display element comprising the color filter as mentioned above.

The reflective display is a display which uses the incoming ambient light to reflect to display the image, such as a reflective liquid crystal display device and an electronic paper display device, etc. The structure and method for producing of the electronic paper display device.

The structure of the embodiment of the electronic paper display element is illustrated in FIGS. 1(*a*), (*b*), 2, and 3(*a*) to (*d*).

As shown in FIGS. 1(*a*) and (*b*), the structure of the display contains at least one micro particle. The micro particle has at least two optical reflectance and charge characteristics. The micro particles constitute a display element 3 (in the embodiment, 3*w* stands for a white micro particle for display; 3W stands for a white display medium constituted by the white micro particle group; 3*b* stands for a black micro particle for display; 3B stands for a black display medium constituted by the white micro particle group). Each of the micro particles 3*w* and 3*b* is affected by an electric field generated by applying voltage between an electrode 5 on a substrate 1 and an electrode 6 on a substrate 2, and moves vertically between the substrates 1 and 2. When users see the black display medium 3B, it appears black; when users see the white display medium 3W, it appears white. Also, as shown in FIG. 1(*b*), a hydrophilic rib 4 is formed between the substrates 1 and 2, and a space is partitioned into a plurality of cells.

Figure 2:
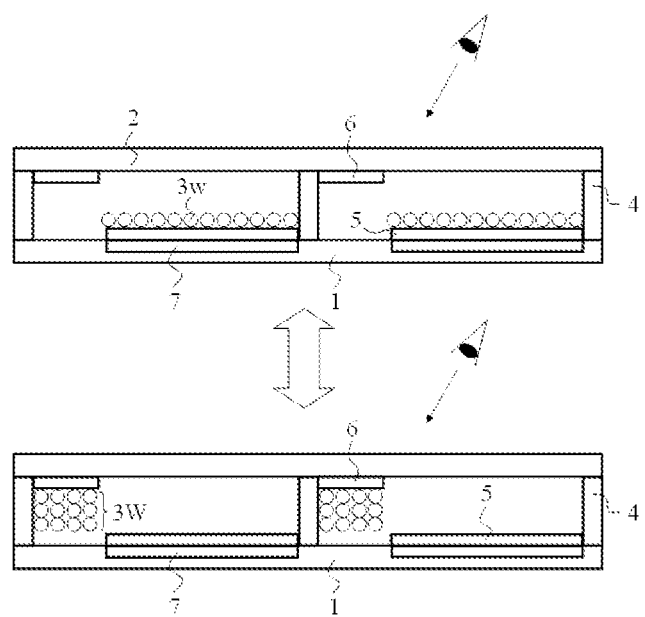
FIG. 2 shows the schematic diagram of the electronic paper display element in the second embodiment of the invention.

Referring to FIG. 2, the structure of the display contains at least one micro particle. The micro particle has optical reflectance and charge characteristics. The micro particles constitute a display element 3 (in the embodiment, 3*w* stands for a white micro particle for display; 3W stands for a white display medium constituted by the white micro particle group). Each of the micro particles 3*w* is affected by an electric field generated by applying voltage between an electrode 5 on a substrate 1 and a an electrode 6 on a substrate 2, and moves vertically between the substrates 1 and 2 by diagonal direction. When users see the white display medium 3W, it appears white, or when users see a color plate 7 set under the transparent electrode 5 on the substrate 1, it appears black. Also, as shown in FIG. 2, a hydrophilic rib 4 is formed between the substrates 1 and 2, and a space is partitioned into a plurality of cells.

Figure 3:
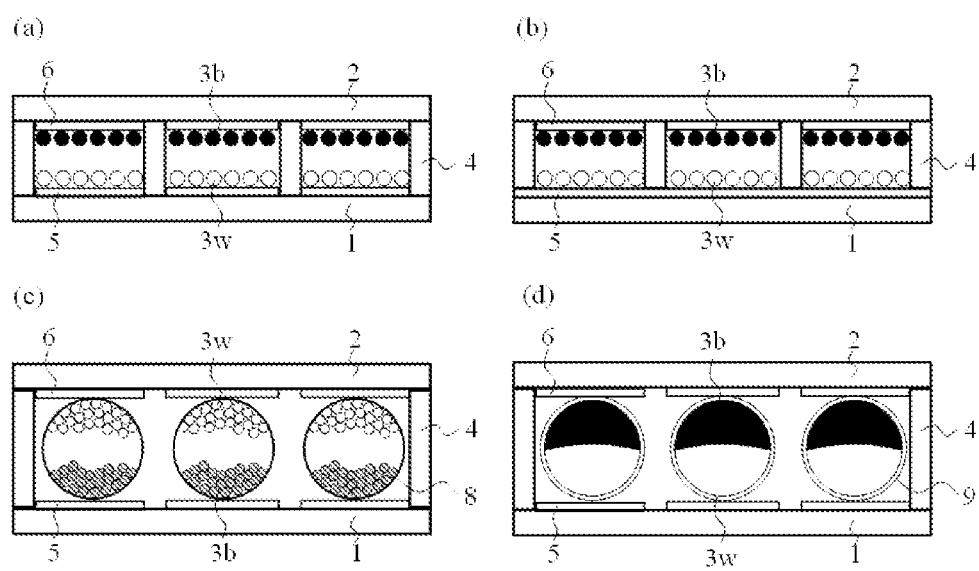
FIGS. 3(a) to (d) show the schematic diagram of the electronic paper display element in the third embodiment of the invention.

In FIGS. 3(*a*) to (*d*), for example, FIG. 3(*a*) shows a medium-driven electronic paper. The white particle 3*w* group and black particle 3*b* group constitute a microcup, the electrodes 5 and 6 are a separate electrode. FIG. 3(*b*) shows a medium-driven electronic paper. The white particle 3*w* group and black particle 3*b* group constitute a microcup, the electrodes 5 and 6 are a linear electrode. In FIG. 3 (*c*), the electrodes 5 and 6 are a separate electrode, and a display element microcapsule 8 is disposed between the substrate 1 and the substrate 2. In FIG. 3 (*d*), the electrodes 5 and 6 are a separate electrode. The display element is a rotating bead 9 with a black side and a white side, and the bead 9 is disposed between the substrate 1 and the substrate 2. The display elements shown in FIGS. 3 (*a*) to (*d*) can be applied to the electronic paper display device according to the present invention.

In the above description, the white display medium 3W constituted by the micro particle group can be replaced by a white medium constituted by liquid powder; the black display medium 3B constituted by the micro particle group can be replaced by a black medium constituted by liquid powder.

Figure 4:
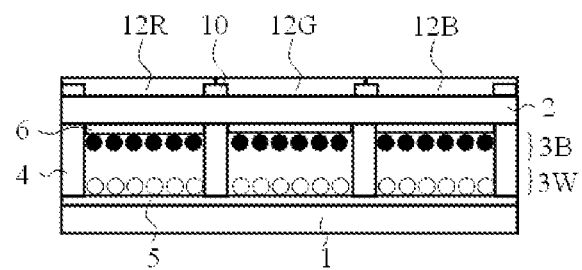
FIG. 4 shows the schematic diagram of the electronic paper display device in the embodiment of the invention.

FIG. 4 shows the schematic diagram of the electronic paper display device in the embodiment of the invention. The hydrophilic rib 4 is used to form three display cells, and then form a single pixel. A white matrix 10 of the color filter is formed on the substrate 2 corresponding to the hydrophilic rib 4. Then, three-color filter fragments 12R, 12G, and 12B are formed on the substrate 2 corresponding to the cells. Finally, the electrode 6 is formed in an interior side of the substrate 2 corresponding to the color filter fragments 12R, 12G, and 12B. When a voltage is applied between the electrodes 5 and 6 to generate an electric field, the electric field causes the display media 3W and 3B in the display cell to move to the lateral side to display colors. In addition, three of the cells having the three primary color filter fragment 12R, 12G, 12B can form a pixel unit. The display cells in the pixel unit control the brightness by the moving of the independent display medium. A variety of colors are achieved by controlling a light source passing through the color filter and by mixing the primary colors.

The technical feature of the electronic paper according to the invention is as a reflective display shown in FIG. 4. The transparent substrate 2 of a watching side can be a film substrate of a resin material. Transparent electrodes 5, 6 are formed on a back side of the transparent substrate 2 and an inner side of the opposite substrate 1. The color filter fragments 12R, 12G, and 12B are formed on an outer side of the transparent substrate 2. The white matrix is formed corresponding to the position of the hydrophilic rib 4, and the color pixels (R, G, and B) are formed corresponding to the position of the transparent electrode 6.

Figure 5:
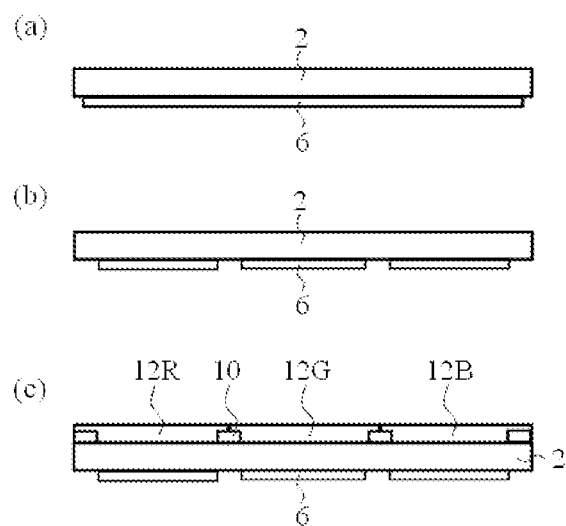
FIG. 5 shows the schematic diagram of the method for producing a color filter of the electronic paper display device.

FIG. 5 shows the schematic diagram of the method for producing a color filter of the electronic paper display device. The method is illustrated below. First, as shown in FIG. 5(a), the transparent electrode 6 such as ITO film is formed on one side of the transparent substrate 2. In FIG. 5(b), patterning the transparent electrode 6. Then, in FIG. 5(c), the white matrix 10 and color filter fragment 12R, 12G, and 12B of red, green and blue pixels are formed on the other side of the transparent substrate 2. The white matrix 10 is formed corresponding to the hydrophilic rib 4 as mentioned above, and the color filter fragment 12R, 12G, and 12B of red, green and blue pixels are formed on the substrate 2 corresponding to the transparent electrode 6 as mentioned above.

In the method for producing the electronic paper display device according to the invention, the color filter is processed additionally to avoid damaging the patterned transparent electrode and color filter fragments. As shown in FIG. 5, a cover film (not shown) can be formed on surfaces of the patterned transparent electrode 6 and/or color filter fragments 12R, 12G, and 12B of the transparent substrate 2.

The following examples are given for the purpose of illustration only and are not intended to limit the scope of the present invention.

EXAMPLE

Preparation of Polysiloxane Polymer (A-1):

A 500 ml three-necked flask was added with 200 g of 4-hydroxy-4-methyl-2-pentanone (hereafter as DAA). 0.4 mol of methyltrimethoxysilane, 0.6 mol of phenyltrimethoxysilane and oxalic acid solution were continually added with stirring at room temperature. The mixture in the flask was then stirred in an oil bath at a temperature of 30° C. for 30 minutes. The temperature of the oil bath was raised to 120° C. within a succeeding 30 minutes. After the inner temperature reached 110° C., the mixture in the flask was further stirred and heated for 6 hours to obtain the polysiloxane polymer (A-1).

Preparations of Polysiloxane Polymers (A-2) to (A-5):

The preparations of polysiloxane polymers (A-2) to (A-5) are similar to the preparation of polysiloxane (A-1), and the kind and amount of the silane compound/siloxane prepolymer were as shown in Table 1. The amount of oxalic acid, reaction temperature and the reaction time of the polycondensation differed from those of the preparation of polysiloxane polymer (A-1) and were also shown in Table 1, and polysiloxane polymers (A-2) to (A-5) were obtained.

TABLE 1

Contents of preparation of polysiloxane polymer (A-1)

| Preparation | Silane Compound/Siloxane prepolymer (mol) | | | | | | | | | Catalyst (g) | | | | Temp. (° C.) | Time (hour) |
| | MTMS | DMDMS | PTMS | PTES | GF-20 | TMSG | TMSOX | DMS-S27 | KBM-503 | PGEE | DAA | water | Oxalic acid | | |
| --- | --- | --- | --- | --- | --- | --- | --- | --- | --- | --- | --- | --- | --- | --- | --- |
| A-1 | 0.40 | | 0.60 | | | | | | | | 200 | 75 | 0.4 | 110 | 6 |
| A-2 | 0.40 | | 0.55 | 0.05 | | | | | | 200 | | 75 | 0.4 | 110 | 6 |
| A-3 | 0.30 | | 0.45 | 0.05 | | | | | 0.20 | 180 | | 75 | 0.4 | 110 | 6 |
| A-4 | | 0.45 | | 0.50 | 0.04 | | | 0.01 | | 100 | 100 | 75 | 0.35 | 105 | 6 |
| A-5 | 0.40 | | 0.30 | 0.25 | | | 0.05 | | | 160 | | 75 | 0.5 | 120 | 6 |

MTMS: Methyltrimethoxysilane
DMDMS: Dimethyldimethoxysilane
PTMS: Phenyltrimethoxysilane
PTES: Phenyltriethoxysilane
GF-20: 3-(triethoxysilyl)propyl succinic anhydride
TMSG: 3-trimethoxysilylpropyl glutaric anhydride
TMSOX-D: 3-ethyl-3-[[3-(trimethoxysilyl)propoxy)methyl] oxetane
DMS-S27: manufactured by Gelest
KBM-503: 3-methylacryloyloxypropyltrimethoxysilane
PGEE: Propylene glycol monoethyl ether
DAA: 4-hydroxy-4-methyl-2-pentanone Preparations of Other Alkali-Soluble Resin:

One part by weight of 2,2'-azobisisobutyronitrile, 240 parts by weight of methoxypropylacetate, 20 parts by weight of methacrylate (hereafter as MAA), and 80 parts by weight of methyl methacrylate (hereafter as MMA) were added into a flask equipped with a equipped with a stirrer and a condenser. The flask was filled with nitrogen and the solution was slowly stirred and heated to 80° C. to mix the reactants and carried out a polymerization for 4 hours. Then, the temperature was raised to 100° C., and 0.5 part by weight of 2,2'-azobisisobutyronitrile was added for polymerization for 1 hour to obtain an alkali-soluble acrylic resin.

Example 1 of Photosensitive Resin Composition

The 100 parts by weight of polysiloxane polymer (A-1), 50 parts by weight of dipentaerythritol hexaacrylate (hereafter as B-1), 20 parts by weight of 1-[4-(phenylthio)phenyl]-octane-1,2-dione 2-(O-benzoyloxime) (hereafter as C-1), 100 parts by weight of $SrTiO_3$ (hereafter as E-1), and 10 parts by weight of phenol novolac epoxy resin (hereafter as F-1-1) were added in the solvent of propylene glycol methyl ether acetate (hereafter as D-1). The compositions were mixed and dissolved using a shaker to obtain a photosensitive resin composition. The photosensitive resin composition was subjected to assays as mentioned below and the results were shown in Table 2.

Examples 2 to 7 of Photosensitive resin Composition

Similar to Example 1, the compositions and amounts shown in Table 2 were mixed and dissolved using a shaker to obtain Examples 2 to 7 of photosensitive resin composition.

Comparative Examples 1 to 5 of Photosensitive Resin Composition

Similar to Example 1, the compositions and amounts shown in Table 3 were mixed and dissolved using a shaker to obtain Comparative Examples 1 to 5 of photosensitive resin composition.

Assays
Heat-Yellowing Resistance:

The photosensitive resin compositions of the examples and comparative examples were spin-coated on a glass substrate (100 mm×100 mm). The films were dried under reduced pressure of 100 mmHg for 30 seconds and pre-baked at a temperature of 90° C. for 2 minutes to form a pre-coated film with a thickness of 1.2 μm. The pre-coated films were irradiated with ultraviolet irradiation of 100 mJ/cm² (Canon PLA-501F). After exposure, the films were then immersed in a developer for 1 seconds at 23° C. and then washed with pure water. After exposure, the films were post-baked for 60 minutes at 230° C. to obtain the white matrix on the glass with a thickness of 1.0 μm.

The chromaticity (L*, a*, b*) of the white matrix was measured by the chromometer CM-600d (Konica Minolta Sensing). The b* values were measured to obtain $b_1^*$. Then, after a heat treatment of 230° C. for 180 minutes, the b* values were measured to obtain $b_2^*$.

$\Delta b = b_2^* - b_1^*$

◎: $\Delta b \leq 1.4$
○: $1.5 \leq \Delta b \leq 1.9$
Δ: $2.0 \leq \Delta b \leq 2.4$
X: $\Delta b \geq 2.5$ Surface Roughness:

The surface roughness of the white matrix was measured with the white light interferometer WLI LAB (manufacture by BMT) to obtain the surface roughness Ra (mm).

◎: $Ra \leq 200$ nm
○: $200$ nm $< Ra \leq 300$ nm
X: $Ra > 300$ nm

Developability:

The integrity of the white matrix formed on the glass substrate was observed.

◎: smooth profile of the pattern
○: smooth profile of the pattern, with slight fluff
Δ: not smooth profile of the pattern, with fluff or detach
X: not smooth profile of the pattern, with severe fluff or detach Reflectivity:

The reflectivity at 60 degree of the white matrix was measured with the gloss meter NOVO Gloss TRIOWLI LAB (manufacture by Rohopoint). The criteria were shown below.

◎: 95% ≤ reflectivity
○: 85% ≤ reflectivity < 95%
Δ: 75% ≤ reflectivity < 85%
X: reflectivity < 75%

TABLE 2

| Components | | Examples | | | | | | |
| --- | --- | --- | --- | --- | --- | --- | --- | --- |
| | | 1 | 2 | 3 | 4 | 5 | 6 | 7 |
| polysiloxane polymer (A) (parts by weight) | A-1 | 100 | | | | | | |
| | A-2 | | 100 | | | | 50 | 100 |
| | A-3 | | | 100 | | | 50 | |
| | A-4 | | | | 100 | | | |
| | A-5 | | | | | 100 | | |
| Other alkali-soluble resin (parts by weight) | | | | | | | | 20 |
| compound having an ethylenically unsaturated group (B) (parts by weight) | B-1 | 50 | 100 | 150 | | | | 50 |
| | B-2 | | | | 30 | 200 | 300 | 50 |
| photoinitiator (C) (parts by weight) | C-1 | 20 | | | 10 | 30 | | |
| | C-2 | | 10 | | | | 100 | 60 |
| | C-3 | | | 30 | | 20 | | |
| solvent (D) (parts by weight) | D-1 | 200 | 500 | 1000 | 1500 | 1000 | 1500 | 500 |
| | D-2 | | | | | | | 500 |

TABLE 2-continued

| pigment (E) (parts by weight) | E-1 | 100 | 200 | | | | | 600 |
|---|---|---|---|---|---|---|---|---|
| | E-2 | | | 300 | 500 | | | |
| | E-3 | | | | | 200 | 400 | |
| crosslinking agent (F) (parts by weight) | F-1 F-1-1 | 10 | | | | | | 5 |
| | F-1-2 | | 20 | | | | | |
| | F-1-3 | | | 40 | | | | |
| | F-1-4 | | 10 | | 60 | | | |
| | F-2 F-2-1 | | | | | 20 | | 15 |
| | F-2-2 | | | | | | 40 | |
| additives (G) (parts by weight) | G-1 | | | | 3 | | | |
| | G-2 | | | | 0.3 | | | |
| Assays | Heat-yellowing resistance | ○ | ○ | ○ | ○ | ○ | ○ | ○ |
| | Surface roughness | ◎ | ◎ | ◎ | ◎ | ○ | ○ | ◎ |
| | Developability | ○ | ◎ | ◎ | ◎ | ○ | ○ | ◎ |
| | Reflectivity | ○ | ○ | ○ | ○ | ○ | ○ | ○ |

| | | |
|---|---|---|
| Other alkali soluble resin | Copolymer of MAA/MMA | |
| B-1 | dipentaerythritol hexaacrylate | TOAGOSEI CO., LTD |
| B-2 | dipentaerythritol tetraacrylate | TOAGOSEI CO., LTD |
| C-1 | 1-[4-(phenylthio)phenyl]-octane-1,2-dione 2-(O-benzoyloxime) | Ciba Specialty Chemicals |
| C-2 | 1-[9-ethyl-6-(2-methylbenzoyl)-9H-carbazole-3-yl]-ethanone 1-(O-acetyloxime) | Ciba Specialty Chemicals |
| C-3 | 2-methyl-1-(4-methylthio phenyl)-2-morpholino propane-1-on/IRGACURE 907 | Ciba Specialty Chemicals |
| D-1 | propylene glycol methyl ether acetate | |
| D-2 | cyclohexanone | |
| E-1 | SrTiO3 | |
| E-2 | TiO2 | |
| E-3 | ZnO | |
| F-1-1 | phenol novolac epoxy resin | |
| F-1-2 | diglycidyl ester type epoxy resin of phthalic acid | |
| F-1-3 | triglycidyl amine type epoxy resin of isocyanuric acid | |
| F-1-4 | Glycidyl acrylate | |
| F-2-1 | CYMEL 303 | Mitsui Chemicals, Inc. |
| F-2-2 | NIKALAC MW-100LM | Sanwa Chemistry Co., Ltd |
| G-1 | KBM-403 | Shin-Etsu Chemical Co., Ltd. |
| G-2 | SF-8427 | Toray Dow Corning Silicon |

TABLE 3

| | | Comparative Examples | | | | |
|---|---|---|---|---|---|---|
| Components | | 1 | 2 | 3 | 4 | 5 |
| polysiloxane polymer (A) (parts by weight) | A-1 | | | | | |
| | A-2 | | 100 | 100 | | |
| | A-3 | | | | | |
| | A-4 | | | | | |
| | A-5 | | | | | |
| Other alkali-soluble resin (parts by weight) | | 100 | | | 100 | 100 |
| compound having an ethylenically unsaturated group (B) (parts by weight) | B-1 | 100 | | 150 | 100 | |
| | B-2 | | 100 | | | 100 |
| photoinitiator (C) (parts by weight) | C-1 | 20 | 20 | | 20 | 20 |
| | C-2 | | | 30 | | |
| | C-3 | | | | | |
| solvent (D) (parts by weight) | D-1 | 1000 | 1000 | 1000 | | 1000 |
| | D-2 | | | | 1500 | |

TABLE 3-continued

| | | | | | | | |
|---|---|---|---|---|---|---|---|
| pigment (E) (parts by weight) | | E-1 | 200 | | | | |
| | | E-2 | | | 300 | 500 | |
| | | E-3 | | | | | |
| crosslinking agent (F) (parts by weight) | F-1 | F-1-1 | 20 | | | | |
| | | F-1-2 | | 20 | | | |
| | | F-1-3 | | | | | |
| | | F-1-4 | | | | | |
| | F-2 | F-2-1 | | | | | |
| | | F-2-2 | | | | | |
| additives (G) (parts by weight) | | G-1 | | | | | |
| | | G-2 | | | | | |
| Assays | | Heat-yellowing resistance | X | O | O | X | X |
| | | Surface roughness | O | O | X | X | X |
| | | Developability | O | O | X | X | X |
| | | Reflectivity | O | X | O | O | X |

| | | |
|---|---|---|
| Other alkali soluble resin | Copolymer of MAA/MMA | |
| B-1 | dipentaerythritol hexaacrylate | TOAGOSEI CO., LTD |
| B-2 | dipentaerythritol tetraacrylate | TOAGOSEI CO., LTD |
| C-1 | 1-[4-(phenylthio)phenyl]-octane-1,2-dione 2-(O-benzoyloxime) | Ciba Specialty Chemicals |
| C-2 | 1-[9-ethyl-6-(2-methylbenzoyl)-9H-carbazole-3-yl]-ethanone 1-(O-acetyloxime) | Ciba Specialty Chemicals |
| C-3 | 2-methyl-1-(4-methylthio phenyl)-2-morpholino propane-1-on/IRGACURE 907 | Ciba Specialty Chemicals |
| D-1 | propylene glycol methyl ether acetate | |
| D-2 | cyclohexanone | |
| E-1 | SrTiO3 | |
| E-2 | TiO2 | |
| E-3 | ZnO | |
| F-1-1 | phenol novolac epoxy resin | |
| F-1-2 | diglycidyl ester type epoxy resin of phthalic acid | |
| F-1-3 | triglycidyl amine type epoxy resin of isocyanuric acid | |
| F-1-4 | Glycidyl acrylate | |
| F-2-1 | CYMEL 303 | Mitsui Chemicals, Inc. |
| F-2-2 | NIKALAC MW-100LM | Sanwa Chemistry Co., Ltd |
| G-1 | KBM-403 | Shin-Etsu Chemical Co., Ltd. |
| G-2 | SF-8427 | Toray Dow Corning Silicon |

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive resin composition comprising:
   a polysiloxane polymer (A);
   a compound having an ethylenically unsaturated group (B);
   a photoinitiator (C);
   a solvent (D);
   a pigment (E); and
   a crosslinking agent (F);
   wherein the pigment (E) comprises at least one selected from the group consisting of titanium dioxide, calcium carbonate, calcium sulfate, zinc oxide, barium sulfate, barium carbonate, silicon dioxide, aluminum powder, kaolin, clay, talc, montmorillonite, aluminum hydroxide, magnesium carbonate, and white hollow polymer microspheres.

2. The photosensitive resin composition according to claim 1, wherein the wherein the polysiloxane polymer (A) is obtained by hydrolyzing and condensing a silane compound represented by Formula (1);

$$Si(R^a)_z(OR^b)_{4-z} \quad \text{Formula (1)}$$

wherein:
z represents an integer from 1 to 3; when z represents 2 or 3, the plural $R^a$s are identical with or different from each other; when 4-z represents 2 or 3, the plural $R^b$s are identical with or different from each other;
at least one of $R^a$ is selected from the group consisting of an anhydride-substituted $C_1$-$C_{10}$ alkyl group, an epoxy-substituted $C_1$-$C_{10}$ alkyl group, and an epoxy-substituted alkoxy group, and the rest of $R^a$ is independently selected from the group consisting of hydrogen, a $C_1$-$C_{10}$ alkyl group, a $C_2$-$C_{10}$ alkenyl group, and a $C_6$-$C_{15}$ aryl group, and $R^b$ is selected from the group consisting of hydrogen, a $C_1$-$C_6$ alkyl group, a $C_1$-$C_6$ acyl group, and a $C_6$-$C_{15}$ aryl group.

3. The photosensitive resin composition according to claim 1, wherein the crosslinking agent (F) comprises an epoxy-containing compound (F-1).

4. The photosensitive resin composition according to claim 3, wherein the epoxy-containing compound (F-1) is selected from the group consisting of (poly)glycidyl ether (F-1-1) obtained by reacting a monohydroxy compound or a polyhydroxy compound with epichlorohydrin; (poly)glycidyl ester (F-1-2) obtained by reacting a (poly) carboxylic acid compound with epichlorohydrin; (poly)glycidyl amine (F-1-3) obtained by reacting a (poly) amine compound with epichlorohydrin; and other epoxy-containing compound (F-1-4).

5. The photosensitive resin composition according to claim 1, wherein the used amount of the compound having an ethylenically unsaturated group (B) is from 30 to 300 parts by weight; the used amount of the solvent (D) is from 200 to 1500 parts by weight; the used amount of the pigment (E) is from 100 to 600 parts by weight; and the used amount of the crosslinking agent (F) is from 10 to 60 parts by weight based on 100 parts by weight of the used amount of the polysiloxane polymer (A).

6. The photosensitive resin composition according to claim 1, wherein the used amount of the photoinitiator (C) is from 10 to 60 parts by weight based on 100 parts by weight of the used amount of the compound having an ethylenically unsaturated group (B).

7. The photosensitive resin composition according to claim 3, wherein the used amount of the epoxy-containing compound (F-1) is from 5 to 60 parts by weight based on 100 parts by weight of the used amount of the polysiloxane polymer (A).

8. A white matrix formed with the photosensitive resin composition according to claim 1.

9. The white matrix according to claim 8, wherein the wherein the polysiloxane polymer (A) is obtained by hydrolyzing and condensing a silane compound represented by Formula (1);

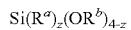

Formula (1)

wherein:

z represents an integer from 1 to 3; when z represents 2 or 3, the plural $R^a$s are identical with or different from each other; when 4-z represents 2 or 3, the plural $R^b$s are identical with or different from each other;

at least one of $R^a$ is selected from the group consisting of an anhydride-substituted $C_1$-$C_{10}$ alkyl group, an epoxy-substituted $C_1$-$C_{10}$ alkyl group, and an epoxy-substituted alkoxy group, and the rest of $R^a$ is independently selected from the group consisting of hydrogen, a $C_1$-$C_{10}$ alkyl group, a $C_2$-$C_{10}$ alkenyl group, and a $C_6$-$C_{15}$ aryl group, and $R^b$ is selected from the group consisting of hydrogen, a $C_1$-$C_6$ alkyl group, a $C_1$-$C_6$ acyl group, and a $C_6$-$C_{15}$ aryl group.

10. The white matrix according to claim 8, wherein the crosslinking agent (F) comprises an epoxy-containing compound (F-1).

11. The white matrix according to claim 10, wherein the epoxy-containing compound (F-1) is selected from the group consisting of (poly)glycidyl ether (F-1-1) obtained by reacting a monohydroxy compound or a polyhydroxy compound with epichlorohydrin; (poly)glycidyl ester (F-1-2) obtained by reacting a (poly) carboxylic acid compound with epichlorohydrin; (poly)glycidyl amine (F-1-3) obtained by reacting a (poly) amine compound with epichlorohydrin; and other epoxy-containing compound (F-1-4).

12. The white matrix according to claim 8, wherein the used amount of the compound having an ethylenically unsaturated group (B) is from 30 to 300 parts by weight; the used amount of the solvent (D) is from 200 to 1500 parts by weight; the used amount of the pigment (E) is from 100 to 600 parts by weight; and the used amount of the crosslinking agent (F) is from 10 to 60 parts by weight based on 100 parts by weight of the used amount of the polysiloxane polymer (A).

13. The white matrix according to claim 8, wherein the used amount of the photoinitiator (C) is from 10 to 60 parts by weight based on 100 parts by weight of the used amount of the compound having an ethylenically unsaturated group (B).

14. The white matrix according to claim 10, wherein the used amount of the epoxy-containing compound (F-1) is from 5 to 60 parts by weight based on 100 parts by weight of the used amount of the polysiloxane polymer (A).

15. A color filter comprising the white matrix according to claim 8.

16. A reflective display element comprising the color filter according to claim 15.

* * * * *